United States Patent
Dierichs

(10) Patent No.: US 7,259,827 B2
(45) Date of Patent: Aug. 21, 2007

(54) DIFFUSER UNIT, LITHOGRAPHIC APPARATUS, METHOD FOR HOMOGENIZING A BEAM OF RADIATION, A DEVICE MANUFACTURING METHOD AND DEVICE MANUFACTURED THEREBY

(75) Inventor: Marcel Mathijs Theodore Marie Dierichs, Venlo (NL)

(73) Assignee: ASML Netherlands B.V., Veldhoven (NL)

( * ) Notice: Subject to any disclaimer, the term of this patent is extended or adjusted under 35 U.S.C. 154(b) by 203 days.

(21) Appl. No.: 10/890,401

(22) Filed: Jul. 14, 2004

(65) Prior Publication Data
US 2006/0012770 A1    Jan. 19, 2006

(51) Int. Cl.
G03B 27/52 (2006.01)
G03B 27/54 (2006.01)
(52) U.S. Cl. .............................. 355/30; 355/67; 355/71
(58) Field of Classification Search ...................... None
See application file for complete search history.

(56) References Cited

U.S. PATENT DOCUMENTS 5,251,070 A * 10/1993 Hashimoto et al. ......... 359/732
6,154,259 A * 11/2000 Hargis et al. ............... 348/756
2005/0185155 A1* 8/2005 Kishikawa ................... 355/30
2005/0237512 A1* 10/2005 Smith et al. ................ 356/124

FOREIGN PATENT DOCUMENTS

JP    2003383732    * 11/2003

* cited by examiner

Primary Examiner—D. Rutledge
(74) Attorney, Agent, or Firm—Pillsbury Winthrop Shaw Pittman, LLP

(57) ABSTRACT

A lithographic apparatus is provided with a diffuser unit including a fluid that includes diffuser particles that are able to diffuse rays in a beam of radiation used to illuminate an object, for example a mask or a wafer. The diffuser particles may be solid particles or gas bubbles in a liquid. The fluid and the diffuser particles may be moved, for example perpendicularly to the beam of radiation, or perpendicularly to a scanning direction of the beam of radiation in a scanning lithographic apparatus, in order to improve the diffusion action. As the radiation to illuminate is diffused and homogenized, subsequent illumination is improved. The apparatus may be used to manufacture CCD's and the like, since when viewed by the human eye they show a homogeneity preferably better than 0.02%.

42 Claims, 3 Drawing Sheets

DIFFUSER UNIT, LITHOGRAPHIC APPARATUS, METHOD FOR HOMOGENIZING A BEAM OF RADIATION, A DEVICE MANUFACTURING METHOD AND DEVICE MANUFACTURED THEREBY

BACKGROUND OF THE INVENTION

1. Field of the Invention

The present invention relates to a diffuser unit, a lithographic apparatus, a method for homogenizing a beam of radiation, a device manufacturing method and a device manufactured thereby.

2. Description of the Related Art

A lithographic apparatus is a machine that applies a desired pattern onto a target portion of a substrate. Lithographic apparatus can be used, for example, in the manufacture of integrated circuits (ICs). In that circumstance, a patterning device, such as a mask, may be used to generate a circuit pattern corresponding to an individual layer of the IC, and this pattern can be imaged onto a target portion (e.g. including part of one or several dies) on a substrate (e.g. a silicon wafer) that has a layer of radiation-sensitive material (resist). In general, a single substrate will contain a network of adjacent target portions that are successively exposed. Known lithographic apparatus include steppers, in which each target portion is irradiated by exposing an entire pattern onto the target portion at once, and scanners, in which each target portion is irradiated by scanning the pattern through the beam of radiation in a given direction (the "scanning" direction) while synchronously scanning the substrate parallel or anti-parallel to this direction.

In a lithographic apparatus it is important to have a good homogeneity of the intensity of the beam of radiation used therein. A better homogeneity, usually expressed as a uniformity value, allows a more constant quality of the details and structures which are obtained in the lithographic process. In the present context, uniformity relates to the variation of the received energy per area on the surface of the object to be illuminated, or more precisely, uniformity= (maximum dose−minimum dose)/(maximum dose+minimum dose). Herein, dose is the cumulated amount of received energy per area. Note that this may relate to overall uniformity, i.e. over all of a relevant area, or to local uniformity, i.e. over only part of the relevant area. Uniformity is preferably as low as possible, with an optimum of 0, i.e. a low value relates to good uniformity. Note that for lithography with a patterned beam of radiation, there are at least two objects which are illuminated, the patterning device and the substrate. Since the substrate is illuminated with a patterned beam, there will be inherent non-uniformities, and uniformity improvement will in this case most often relate to illumination of the patterning device. In all cases, it will be easy to identify the object or surface which is to be illuminated with a beam that is as uniform as possible.

In known lithographic apparatus there is often a built-in diffuser unit. Herein diffuser unit relates to a unit, constructed and arranged to make the beam of radiation more homogeneous, i.e. more uniform, before it strikes a surface to be illuminated, such as a patterning device (e.g. a mask). Known diffuser units are static. This means that they have a certain predetermined and constant influence on the distribution of radiation in the beam of radiation. Even though in theory, i.e. with an extremely constant radiation distribution in the beam of radiation, very good uniformity is obtainable, the known apparatus has the disadvantage that, when there is a slight change in the distribution, which may be due to various causes, the new distribution may be worse than before, even with the known diffuser unit. In other words, the known apparatus does not always offer the desired uniformity of the beam of radiation.

SUMMARY OF THE INVENTION

It is an aspect of the present invention to provide a lithographic apparatus in which the beam of radiation can be made more uniform, even in situations without a constant radiation distribution.

According to an embodiment of the present invention, a lithographic apparatus includes an illumination system configured to provide a beam of radiation, a support configured to support a patterning device, the patterning device configured to impart the beam of radiation with a pattern in its cross-section, a substrate table configured to hold a substrate, a projection system configured to project the patterned beam onto a target portion of the substrate, and a diffuser unit configured to homogenize the beam of radiation, the diffuser unit being present in an optical path of the beam of radiation and including a body of fluid, the fluid containing diffuser particles.

By providing such a diffuser unit with a body of fluid containing diffuser particles, a dynamic diffuser is provided, which allows the diffuser particles to move in the fluid, thus taking up various positions, and thus causing the radiation in the beam to be spread even more uniformly, on average. In a fluid, the particles are movable, whereas in a rigid body they are not. Note that there is not just the possibility of moving the particles by some external movement mechanism, but there is the inherent movement known as the Brownian movement. Hence, in this way, a dynamic diffuser unit is obtained. Herein, dynamic means that the diffusive action of the diffuser particles changes in time due to their own movement. The more homogeneous illumination which is thus possible improves the quality of subsequently illuminated substrates, such as ICs, etc.

The diffuser unit will be present in an optical path of the beam of radiation, which means that at least a part of the beam of radiation travels through the diffuser unit, over a certain pathlength. This may mean that the beam of radiation travels through the diffuser unit, the latter being transparent, or that the beam of radiation penetrates into the diffuser unit and is subsequently reflected or retroreflected.

The diffuser unit should be present in the optical path in a position where the radiation is influenced by diffusion before the beam of radiation actually illuminates the surface or object to be illuminated. Hence, the diffuser unit is present between the illumination system and the substrate, or more generally an object to be illuminated, and in particular between the illumination system and the support. The diffusion action may thus take place before illumination of a object, or patterning device, respectively. In practice, a position between an illumination system and a patterning device is preferred because the diffusion action of the diffuser unit will blur and smear out the pattern in the beam of radiation. Nevertheless, other locations are not excluded, depending on the position of the surface to be illuminated. In fact, the diffuser unit will diffuse the beam of radiation and any information (e.g. pattern) it may contain up to the position of the diffuser unit. Note that, since the diffusion as discussed here should preferably cause a spread in position of the rays, and not in the angles under which they will be incident on the surface to be illuminated, the diffusion action should preferably take place in or near a pupil plane.

In the present context, the term "diffuser particles" not only relate to physical entities such as granules or dust-like particles, but also to entities like gas bubbles, droplets of a liquid which is immiscible with the fluid, and in fact to all entities that may cause diffusion of radiation through reflection, refraction or scattering. Examples of such a fluid are colloidal fluids or suspensions, wherein small particles, down to molecular size, float in a liquid. Examples of "diffuser particles" that are not truly tangible physical particles are density waves or shock waves, "vacuum bubbles" or eddies or vortices. In other words, the concept of "particle" should be interpreted very broadly.

The diffuser particles have a diffusive action without absorbing much of the radiation that is incident on the particles. Absorption of radiation causes a change in the intensity distribution by a different mechanism, by taking away a part of the radiation instead of redistributing the radiation. For example, a dye or an ink that absorbs a relatively large amount of incident radiation, and thus has a high absorptivity of, for example, more than 0.5, should not be used as diffuser particles. It is desirable for efficiency to maintain as high an overall intensity as possible. Hence, the diffuser particles should have a low absorptivity, such as less than 0.5, preferably less than 0.2 with respect to the incident radiation. This absorptivity may, for example, relate to the intrinsic absorptivity value of the material of the diffuser particles, e.g. of a corresponding solid body that is made thereof. Alternatively, it can be an intensity ratio of radiation that is absorbed by a diffuser particle and radiation that is incident thereon. The latter absorptivity value is less well defined since this may also depend on the size, the shape, etc. of the diffuser particle, but it may be a useful value if a corresponding intrinsic absorptivity value may not be easily determined, e.g. in the case of gas bubbles, eddies, etc. It is important that the effect of absorption does not predominate over the diffusion action. All absorptivity values should relate to the radiation that is actually used, in practice most often, but not exclusively, monochromatic ultraviolet radiation.

The diffuser particles are preferably present in suitable positions for exerting a diffusion action on the beam of radiation. They may be suspended in the fluid. They need not be present in a homogeneous way, but may for example be present in a higher concentration towards the bottom of the body of fluid. For better control of the diffusion properties, the diffuser particles are present in a homogeneous distribution in the fluid. Alternatively, the diffuser particles may float on a surface of the liquid. This embodiment is especially useful in the case of reflective optics, since the diffusion action may be achieved by reflecting light at a surface of the fluid that is provided with floating diffuser particles. Nevertheless, in the case of transmissive optics, such a layer of floating diffuser particles may be used as well.

In the present text, the term "fluid" encompasses not only liquids, but also gases. Gases may also serve as carriers for diffuser particles, e.g. in the form of "smoke" or "fog". Although it is preferred to use a liquid as the fluid for reasons of controllability, the term fluid will be used throughout the text, to encompass the other possibilities.

In another embodiment of the lithographic apparatus according to the present invention, the lithographic apparatus is of the scanning type, at least one of the support and the substrate table being movable in a scanning direction with respect to the beam of radiation.

In the case of a lithographic apparatus of the scanning type, a dynamic diffuser unit according to the present invention is more desirable than known static diffuser units. As mentioned above, in a scanner type of lithographic apparatus, a surface to be illuminated is scanned by a beam of radiation, which is often relatively narrow. In a case where a prior art static diffuser unit causes a local inhomogeneity in the beam of radiation on the surface to be illuminated, the result will be a darker or lighter line or stripe on that surface. The lithographic apparatus according to the present invention, to the contrary, produces a randomized inhomogeneity, which is desirable in many cases, since even an equally large local inhomogeneity will not become visible as a stripe, or at least much less so.

In another embodiment, the fluid fills a space that extends between a part of the illumination system and the substrate, desirably in particular from a first lens element of the illumination system to one of a second lens element of the illumination system and the patterning device. In the latter embodiment, it is understood that the illumination system includes an illuminator lens having a plurality of lens elements. The body of fluid may extend between two lens elements, or alternatively or additionally between a lens element (usually a final lens element) of the illuminator lens and the patterning device. Again, a position somewhere between a first element of the illumination system and the patterning device is desirable over a position between the patterning device and the object to be illuminated, since otherwise the diffuser unit would blur the pattern in the beam of radiation. Yet, such a position is not excluded, for example when a very slight diffusion of the pattern is intended.

It is noted here that the terms "first" and "second" lens element relate to two random lens elements of the plurality of lens elements of the illumination system, or if desirable of the projection system. However, the first lens element as seen by the beam of radiation when entering the illumination system or projection system is also called the "first lens element," while the last lens element as seen by the beam of radiation is called "final lens element". The context will denote clearly whether a random first element is meant, such as in the presently described embodiment, or whether the first outermost lens element, with the first position with respect to the beam of radiation, is meant.

The fluid extends over at least substantially a cross-sectional area of the beam of radiation. In this way, it is ensured that the fluid and its diffuser particles provide the diffusion action over the entire beam of radiation, and hence over the entire illuminated surface. It is not necessary that the fluid extends over the entire beam of radiation, although a partial extension may cause intensity problems since radiation is taken out of a part of the beam by diffusion, and added to a different part of the beam.

In the case of a scanning type of lithographic apparatus, with a scanning direction, it may be desirable that the fluid extends over at least the full length of the beam, i.e. in the direction perpendicular to the scanning direction, since then also the fluid and the diffuser particles exert their diffusion influence over the entire illuminated surface. Here also, it is even more desirable when the fluid extends over substantially a full cross-sectional area of the beam of radiation.

The fluid may be positioned between two optical elements, in particular between the first and second lens elements, in such a way that a pupil plane is situated in the fluid. This may relate to an internal pupil plane within the lens system. This position ensures that the diffusion action of the diffuser particles can take place in a preferred location, where angles in the beam of radiation are affected. However, other positions are not excluded.

It is also possible to have more than one body of fluid in the apparatus. One such embodiment would be to provide a first fluid body in contact with a final lens element of an illumination lens or projection lens, as well as a second body of fluid in contact with a surface to be illuminated, such as a patterning device or wafer, wherein the first and second bodies of fluid are separated by a transparent partition, such as a membrane. In this case it is possible to have different fluids, with different properties. For example, the first fluid may be protecting the lens element, while the second fluid has the desired optical properties to function as a lens element, while at least one of the bodies may be provided with diffuser particles according to the present invention. Details as to this two-fluid measure may be found in European Patent Application 03255377.8, which is hereby incorporated by reference.

There are lithographic apparatus that are based on the immersion principle in which the optical element of a lens which is nearest to a surface to be illuminated or exposed is immersed in a fluid with a predetermined refractive index. By selecting a fluid with an appropriate refractive index, various lens properties may be improved or set, such as numerical aperture. In other words, the fluid acts as an additional optical element of the lens. Usually this relates to a projection system final lens and a wafer substrate. This same position for the body of fluid is possible according to the present invention. However, it is more desirable to provide a body of fluid between an illuminator's final lens and a patterning device, since often it is desired to provide a diffused and homogenized beam to the patterning device. In a lithographic apparatus according to the present invention, the fluid may be provided with diffuser particles, such that the fluid will additionally serve as a diffuser unit. This limits the number of additional components.

Note that in prior art immersion systems, it is important that the body of liquid is as clear and transparent as possible. Hence, gas bubbles, impurities, etc. in the liquid were avoided as much as possible. This takes away the possibility to introduce a desired diffusion action due to purposively introduced diffuser particles according to the present invention. However, position of the immersion fluid and that of the body of fluid of the diffuser unit according to the present invention differs, as discussed above. Immersion fluid is most often present after the patterning device and right before the substrate, whereas the diffuser body of fluid is preferably present before the patterning device. Their function and position are separated.

It is possible to provide the diffuser unit including the body of fluid at other positions in the apparatus. In another embodiment, the fluid is present between two optical elements, which may be parallel, but not necessarily. Such elements may both be transmissive, e.g. plane-parallel sheets of a transparent material, such as glass or quartz.

Alternatively, at least one element may be reflective. For example, a first element may be transparent, while a second may be reflective. In this case, a beam of radiation will enter the diffuser unit through the transparent element, will be reflected by the second element, and will leave the diffuser unit again through the first element. It is also possible that both elements are reflective, since then the beam of radiation may travel through the diffuser unit by internal reflection. Partially transmissive or partially reflective elements or combinations are also possible.

The optical elements may enclose the fluid in a space. The space need not be sealed on all sides, but may be flushable. Enclosing the fluid between such optical elements prevents the fluid from influencing other parts of the apparatus. For example, the fluid cannot contaminate the rest of the system, nor vice versa. Changing a fluid, when desired, is also simplified. This may, for example, be achieved by flushing the space between the parallel elements or by simply removing the parallel elements together with the fluid. Note that it is of course also possible to provide the fluid in a completely closed circuit. This allows use of the diffuser unit in an otherwise evacuated space.

It is not necessary to provide parallel optical elements. If desired, the optical elements may have any other shape, such as a lens shape, or orientation with respect to each other. However, if the elements are parallel, the shape therebetween, when completely filled with fluid, will influence the beam of radiation therethrough to the least extent. The number of parallel elements may be larger than two, and fluid may be present between more than two optical elements.

The fluid and a material of at least one of the parallel optical elements or an optical element of the projection lens may have indices of refraction that differ less than about 0.2. If the refractive indices of the fluid and of the optical element in contact therewith are matched, i.e. the difference of the relevant refractive indices is made as small as possible, in particular less than about 0.2 and preferably about zero, then the influence of the fluid on the optical path of the beam of radiation is diminished even further. It is, however, in no way excluded to have a larger index difference.

In another embodiment, the lithographic apparatus further includes a diffuser particle movement mechanism configured to impart movement to the diffuser particles. Hence the diffusing action, or the dynamic behavior, of the diffuser particles is even further improved, and improved homogeneity of the resultant illumination may be obtained under even more different and difficult circumstances.

Note that diffuser particles in a fluid undergo Brownian movement, which is an inherent diffuser particles movement. However, sometimes this natural movement is insufficient. To enhance this movement, and the dynamic character, it is possible to use smaller diffuser particles. Alternatively, it is possible to use a fluid heater to heat the fluid of the fluid body. A higher temperature of the fluid means a stronger Brownian movement of the diffuser particles, and thus a better homogenizing of the beam of radiation.

The diffuser particle movement mechanism may include radiators of electromagnetic or sound waves, which waves interact with the diffuser particles and cause a movement thereof. Electromagnetic radiators also include electromagnetic field generators, that may move the diffuser particles due to an electromagnetic field (an electric field causing a dipole attraction, a magnetic field, a combination thereof, and in all cases either a static field or a varying field). It may be desirable to provide the diffuser particles with an electrical charge, and/or magnetic particles, to enhance the effect of the generated electromagnetic field.

An example of an electromagnetic radiator is an optical source, such as a laser, that may provide optical pulses to the diffuser particles. By absorbing such a pulse, the momentum of the pulse will cause a change of motion of the diffuser particle involved. It is desirable to use optical radiation for which the substrate to be illuminated is not sensitive, since otherwise the radiation of the electromagnetic radiator may affect the desired exposure.

An alternative diffuser particle movement mechanism includes a fluid pump configured to impart movement to the fluid. The movement imparted to the fluid, which is controllable, ensures that the diffuser particles in the fluid undergo a motion as well. Hence, the diffusing action of the diffuser particles is even further improved, and the homogeneity of the resultant illumination may be obtained under even more different circumstances. It is of course possible to provide more than one diffuser particle movement mechanism, in order to be prepared for more than one type of diffuser particle or movement thereof.

The kind of movement imparted to the diffuser particles and/or the fluid is not limited. For example, the movement may be linear in any desired direction, it may be oscillatory, or even random in many directions, it may be an eddy, and so on. Even if the direction is along an optical axis of the beam(s) of radiation, the varying position of the diffuser particles may have a diffusing effect on the beam of radiation, since the diffuser particles exert their influence on varying distances from the surface to be illuminated, for example a patterning device. However, the movement of the fluid may have a component which is perpendicular to an optical axis of the lithographic apparatus, since then the effect of the moving diffuser particles will be most pronounced.

The movement of the diffuser particles or fluid may be substantially perpendicular to the beam of radiation, i.e. the (average) direction of propagation of the radiation in the beam of radiation. In certain cases, such as dipole radiation, it may be more accurate to take the optical axis as the direction, perpendicular to which the diffuser particles or fluid is preferably moved. In this way, the diffuser particles move quickest through the beam of radiation, and will hence give the most dynamic results. Alternatively, the lithographic apparatus has a scanning direction, and the movement of the diffuser particles fluid is substantially perpendicular to the scanning direction. Especially in the case of a scanning type of lithographic apparatus, a substantially perpendicular movement of the diffuser particles or fluid ensures desirable dynamic behavior of the diffuser particles in the fluid with respect to the beam of radiation that scans the surface to be illuminated. In other words, from the point of view of the beam of radiation, the diffuser action changes fastest when the diffuser particles' or fluid's relative movement is perpendicular to the direction of the scanning beam of radiation. In this context, the expression "substantially perpendicular" relates to the angle between the direction of movement of the fluid and the scanning direction being at least 45°, preferably at least 80°. It is however not excluded to allow different directions of movement, for example in the case of constructional constraints.

The dynamic diffusion action, i.e. the dynamic behavior of the diffuser unit, depends on the velocity of the diffuser particles with respect to the object being illuminated, or with respect to a relative velocity with which the beam of radiation moves over the object to be illuminated. Note that often the object moves with respect to a stationary beam. In general, a higher velocity of the diffuser particles gives a more pronounced diffusion action. Generally, the velocity of the diffuser particles is determined by the velocity of the fluid. Hence, a higher velocity which is imparted to the fluid gives a higher velocity of the diffuser particles, although this need not be an exact one to one correspondence.

The diffusion action further depends on the concentration of diffuser particles as seen by the beam of radiation. In general, a higher number of diffuser particles will cause a higher diffusion of the radiation. A higher number may be achieved by providing a higher concentration of diffuser particles in the fluid, but also by providing a thicker layer of fluid, with the same concentration. If desired, the number and/or concentration of diffuser particles in the fluid may be adjusted dynamically.

The fluid may include water. Water is inexpensive, very stable, also under the influence of ultraviolet radiation, very transparent down to very short wavelengths, such as 193 nm or 248 nm, it is easily obtained in a very pure form, etc. However, this embodiment should in no way be construed as limiting as to the type of fluid to be used in the diffuser unit. Other fluids may be desirable under certain circumstances. Examples are various oils and resins, such as silicones, as well as various organic fluids, such as alcohol or halogenated hydrocarbons. In particular, materials like perfluorinated polyethers are useful down to 193 nm.

The diffuser particles may have an average diameter of at most 200 µm, preferably at most about 5 µm, even more preferably of at most 200 nm, and most preferably about 10 and about 20 nm. Diffuser particles with an average diameter of at most 200 µm may give satisfactory results, especially in a position well out-of-focus of the image plane. In general, smaller diffuser particles will give more homogeneous results, and an average diameter of at most 5 µm is satisfactory in many cases. An average diameter of at most 200 nm provides a diffuser particle that is at most as large as the diffraction limit, i.e. generally about half of the used wavelength. In that case, specific details of the diffuser particle are smeared out, and an even more uniform illumination may be obtained. The most desirable results are believed to be possible with an average diameter of between about 10 and about 20 nm. It is also believed that there is a preferred minimum size to the diffuser particles, of about 5 nm, although this depends on the particular type of particle. Note that water molecules themselves, although present in abundance, do not provide the required or desired diffusion action, and are believed to be too small.

The desired dimensions are also dependent of the position of the diffuser particles. In particular, when the fluid with the diffuser particles is in contact with the surface to be illuminated, such as a substrate to be exposed, it is desirable to have a maximum dimension of the diffuser particles that is less than a desired critical dimension of the structure on the substrate, in order to prevent imaging of the diffuser particle on the substrate. The maximum dimension may be 50 nm.

Alternatively, if the fluid with the diffuser particles is present in an intermediate plane, or a pupil plane, the dimensions of the diffuser particles may be much larger than the above mentioned 50 nm, since images thereof are much more smeared out. The minimum dimensions may be between 0.5 and 1 µm. This allows the particles to be more easily controlled in their movements.

In another embodiment, the diffuser particles include at least one of gas bubbles and solid particles. Gas bubbles have a shape that is well known, and thus the optical properties are well known also. Solid particles may vary slightly more in shape from particle to particle, but they may be obtained in many more different shapes, e.g. depending on crystal properties. Furthermore, the optical diffusion action of a gas bubble depends for a large part on reflection and/or diffraction at the fluid/gas boundary, whereas the diffusion action of solid particles may depend to a larger extent on reflection at its surface, and on the reflection coefficient of the specific material. Note, however, that when the dimensions of the diffuser particles decrease, the diffusion action depends less and less on these mentioned properties. Another advantage of gas bubbles and/or solid particles is that they may be easily dispersed, suspended or distributed in the fluid in any desired way. Hence a homogeneous colloidal fluid, suspension, etc. may easily be obtained. However, other types of diffuser particles are not excluded, e.g. pressure waves, that cause diffusion by varying the local density of the fluid, etc.

With respect to stability of the diffuser particles in the fluid, solubility may be a criterion to be observed. For example, the solubility of many gases, salts etc. varies strongly, not only depending on temperature, but also as an absolute value between substances. However, such behavior is generally well known, and it should be appreciated that appropriate material for the diffuser particles may be selected based on such criteria.

The gas may include at least one of air, nitrogen or an inert gas. These gases are readily available, easily handled and are to a large extent stable under the influence of ultraviolet radiation. However, in principle any type of gas may be suitable. Of course, the gas should be present in the form of bubbles to be able to perform its diffusion action.

In another embodiment, the solid particles include a reflective or refractive material. Such materials may include particles of glass, quartz, metal, plastics etc. In principle, a vast range of different materials is available, and may be selected according to specific circumstances and desired properties. For example, many glasses and quartz are transparent, and have a refractive index that does not differ very much of many fluids. In those cases, the diffusion actions will be mild. Contrarily, small particles of precious metal, such as gold, or similar materials, have a high reflectivity and will show a much more pronounced diffusion action. Note that, as mentioned above, it is desirable to have a material for the diffuser particle that has a low absorptivity for the radiation used in the beam of radiation, since otherwise any desired homogenizing action through diffusion would be counteracted by local absorption. As mentioned before, the absorptivity value may relate to the intrinsic absorptivity of a solid body of the material, and should be smaller than 0.50 for the radiation used in the beam of radiation, and preferably be less than about 0.20, although lower values would be even better. Hence dye particles, ink particles, etc., should not be used if they have a relatively large absorptivity.

In another embodiment, the diffuser unit is connectable to at least two containers containing different substances, at least one of which is a fluid. This offers the possibility of changing the fluid itself, changing the composition of the fluid and varying the amount or type of diffuser particles in the fluid, or a combination thereof. Hence the diffusion action may be varied even more dynamically. The number of containers is of course not particularly limited, and may be adjusted to a desired degree of flexibility.

In another embodiment of the lithographic apparatus, the diffuser unit further includes a particle controller configured to control a diffuser particle content of the fluid. The particle controller may relate to a control valve, for example, configured to determine an amount of particles to be released in the fluid, or of an amount of fluid containing a certain concentration of diffuser particles, into an already present amount of fluid, etc.

In another aspect of the present invention, a diffuser unit is configured for use in a lithographic apparatus according to the present invention. This may relate to any body of liquid, and in particular to a container containing such a body of liquid, which is configured to homogenize radiation by diffusion in a lithographic apparatus. In principle, all of the above mentioned details as to the diffuser unit in the lithographic apparatus according to the present invention also hold for the diffuser unit by itself. Examples are a diffuser unit with a pump to impart movement to the fluid therein, a container including a closed circuit or two parallel optical elements with a space for the fluid, various types of fluids and diffuser particles, etc.

In another aspect of the invention, a method of homogenizing a beam of radiation includes providing a beam of radiation, providing a body of fluid containing diffuser particles, the body of fluid being provided in such a position that at least part of the beam of radiation travels through at least a part of the diffuser unit, and moving the fluid with respect to the beam of radiation. In this method, use is made of the effect as described above, i.e. homogenizing radiation by diffuser particles in a fluid.

This method provides for more dynamic homogenizing of the beam of radiation. This holds especially for the embodiment wherein the diffuser particles are moved with respect to the beam of radiation, in particular in a scanning type of illumination. Preferably, the direction of movement of the fluid is substantially perpendicular to a scanning direction.

In another embodiment of the method, a diffuser particle content in the fluid is controlled to provide a desired amount of diffusion in the beam of radiation. By controlling the diffuser particle content in the fluid, one is able to set a desired level of diffusion in the beam of radiation. Control of the content may be obtained by operating a control valve, or simply adding the desired amount of particles, or any suitable way.

Furthermore, the present invention relates to a method for manufacturing a device, including providing a beam of radiation, patterning the beam of radiation with a pattern in its cross-section, and projecting the patterned beam of radiation onto a target portion of a substrate, wherein a body of fluid containing diffuser particles is provided in a position that is crossable by the beam of radiation. In this device manufacturing method, use is made of the diffusing effect of diffuser particles in a fluid. As mentioned above, by this method a more uniform illumination by a more homogenized beam of radiation may be obtained, thus providing devices with better quality.

At least one of the patterning device and the substrate is moved in a scanning direction with respect to the beam of radiation. The fluid and/or the diffuser particles may be moved with respect to the beam of radiation, or substantially perpendicularly to the scanning direction. The results associated with these embodiments are similar to those of the corresponding embodiments of the lithographic apparatus described above, and are not repeated here for brevity's sake.

In another embodiment, the device includes a charge coupled device (CCD) or CMOS device. It is desirable to avoid brighter or darker lines or stripes on the surface of such a device. Since many CCDs are used in optical applications, where the signal they deliver is viewed by the human eye, homogeneity is of high importance. More precisely, the eye is able to discern local inhomogeneities in illumination of about 0.02% within a range of, say, 1 mm when imaged in resist at an energy just below the energy to clear the resist. Most if not all presently known device manufacturing methods and apparatus have an achievable uniformity of only 0.5–1%. Note that a similar 0.02% dose spread over a large area would not be visible. In other words, the local derivative of the dose is a factor that relates to the visibility of the inhomogeneity, wherein a small but very local change is visible, whereas a larger but more widespread change is not. Stepper type lithographic apparatus have often been used for CCD applications. Steppers do not scan, and thus do not form stripes. Steppers may be equipped with static diffusers, and because of the lack of stripes, local non-uniformities will be hardly visible. Nevertheless, even with steppers, homogeneity may be improved with a dynamic diffuser unit according to the present invention. For next generation CCDs, such as CCDs with larger dimensions, stepper type lithographic apparatus would no longer be satisfactory, and the use of scanner type lithographic apparatus, with their larger field size, may be required. Scanners were never used for CCD applications due to the occurrence of stripes in the resist, which are expected to affect the imaging quality of the eventual CCD negatively. Providing a diffuser unit according to the present invention in a scanning type of lithographic apparatus makes the latter eminently suitable for CCD applications, due to the suppression of stripes in the image.

The lithographic apparatus, diffuser unit, and methods of the present invention provide a better uniformity and help to reduce or even eliminate the presence of lines and stripes in or on CCDs. However, these results are applicable to any device manufactured by lithography, such as various other types of IC's and so on.

Another aspect of the present invention relates to the use of a liquid with diffuser particles as a diffuser unit in lithography. In other words, the actual use of such a liquid as a diffuser unit, with its associated resutlts as described above, is part of the present invention. Notably, the more dynamic diffusion action of such a liquid, and the obtainable better uniformity of a beam of radiation, is desirable.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains one or more processed layers.

The terms "radiation" and "beam" used herein encompass all types of electromagnetic radiation, including ultraviolet (UV) radiation (e.g. having a wavelength of 365, 248, 193, 157 or 126 nm) as well as particle beams, such as ion beams or electron beams.

The term "patterning device" used herein should be broadly interpreted as referring to a device that can be used to impart a beam of radiation with a pattern in its cross-section such as to create a pattern in a target portion of the substrate. It should be noted that the pattern imparted to the beam of radiation may not exactly correspond to the desired pattern in the target portion of the substrate. Generally, the pattern imparted to the beam of radiation will correspond to a particular functional layer in a device being created in the target portion, such as an integrated circuit.

Patterning devices may be transmissive or reflective. Examples of patterning device include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned. In each example of patterning device, the support may be a frame or table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the beam of radiation, and such components may also be referred to below, collectively or singularly, as a "lens".

The lithographic apparatus may be of a type having one, two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the present invention will now be described, by way of example only, with reference to the accompanying drawings in which corresponding reference symbols indicate corresponding parts, and in which.

DETAILED DESCRIPTION

Figure 1:
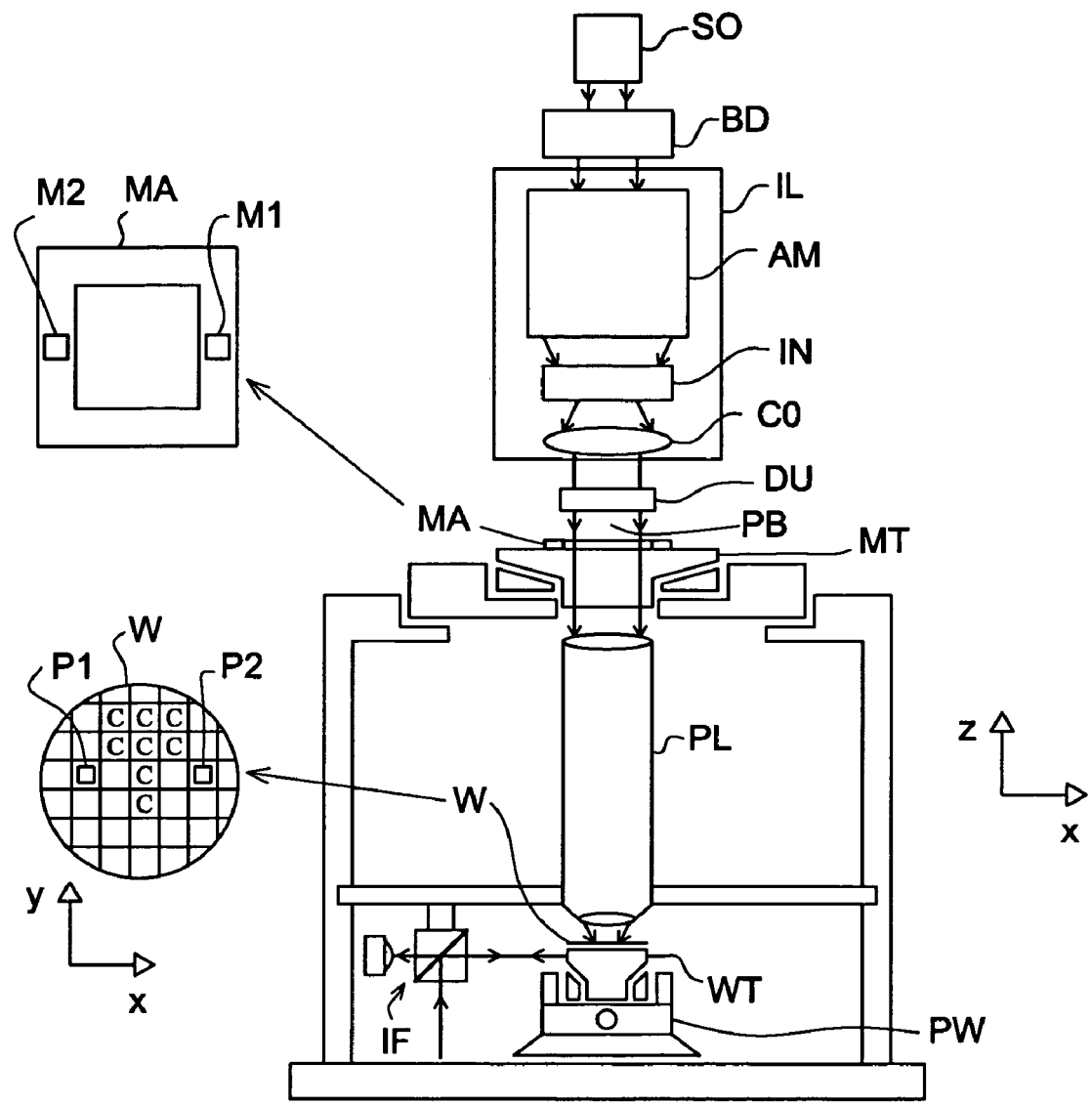
FIG. 1 schematically depicts a lithographic apparatus according to an embodiment of the present invention.

Referring to FIG. 1, a lithographic apparatus according to the present invention includes an illumination system (illuminator) IL configured to provide a beam of radiation PB (e.g. UV radiation). A support (e.g. a mask table) MT supports a patterning device (e.g. a mask) MA and is connected to a first positioning device PM that accurately positions the patterning device with respect to a projection system PL. A diffuser unit DU is provided between the projection system and the support MT, although it may be provided elsewhere in the apparatus. A substrate table (e.g. a wafer table) WT holds a substrate (e.g. a resist-coated wafer) W and is connected to a second positioning device PW that accurately positions the substrate with respect to the projection system PL. The projection system (e.g. a refractive projection lens) PL images a pattern imparted to the beam of radiation PB by the patterning device MA onto a target portion C (e.g. including one or more dies) of the substrate W.

As here depicted, the apparatus is of a transmissive type. Alternatively, the apparatus may be of a reflective type. In such a case, use may be made of a fluid, on the surface of which the diffusion particles may be floating.

The diffuser unit DU includes a body of liquid containing diffuser particles. The diffuser unit DU receives radiation from the illuminator IL and homogenizes the radiation thereby improving the uniformity thereof. The homogenized radiation is provided as a beam of radiation PB to a patterning device MA.

The illuminator IL receives radiation from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be integral part of the apparatus, for example when the source is a mercury lamp. The source SO and the illuminator IL, together with the beam delivery system BD if required, may be referred to as a radiation system.

The illuminator IL may include an adjusting device AM to adjust the angular intensity distribution of the beam. Generally, at least the outer and/or inner radial extent (commonly referred to as sigma-outer and sigma-inner, respectively) of the intensity distribution in a pupil plane of the illuminator can be adjusted. In addition, the illuminator IL generally includes various other components, such as an integrator IN and a condenser CO. The illuminator provides a conditioned beam of radiation PB having a desired uniformity and intensity distribution in its cross-section.

The beam of radiation PB is incident on the mask MA, which is held by the mask table MT. Having traversed the mask MA, the beam of radiation PB passes through the projection system PL which focuses the beam onto a target portion C of the substrate W. With the aid of the second positioning device PW and a position sensor IF (e.g. an interferometric device), the substrate table WT can be moved accurately to position different target portions C in the path of the beam PB. Similarly, the first positioning device PM and another position sensor (e.g. another interferometric device which is not explicitly depicted in FIG. 1) can be used to accurately position the mask MA with respect to the path of the beam PB, e.g. after mechanical retrieval from a mask library, or during a scan. In general, movement of the object tables MT and WT will be realized with the aid of a long-stroke module (coarse positioning) and a short-stroke module (fine positioning), which form part of the positioning devices PM and PW. However, in the case of a stepper, as opposed to a scanner, the mask table MT may be connected to a short stroke actuator only, or may be fixed. Mask MA and substrate W may be aligned using mask alignment marks M1, M2 and substrate alignment marks P1, P2.

The depicted apparatus can be used in the following preferred modes:

1. In step mode, the mask table MT and the substrate table WT are kept essentially stationary, while an entire pattern imparted to the beam of radiation is projected onto a target portion C at once (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the beam of radiation is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width in the non-scanning direction of the target portion in a single dynamic exposure, whereas the length of the scanning motion determines the height in the scanning direction of the target portion.

3. In another mode, the mask table MT is kept essentially stationary holding a programmable patterning device, and the substrate table WT is moved or scanned while a pattern imparted to the beam of radiation is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2A:
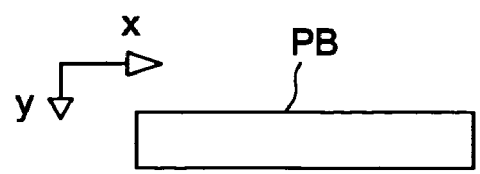
FIGS. 2a and 2b depict a cross-section, and an intensity profile, of a beam of radiation used in a method according to the present invention, respectively.

Referring to FIG. 2a, a cross-section of the beam of radiation PB which may be used in a scanning type of lithographic apparatus may be elongated. As just one of many possible examples, the dimensions may be X×Y=26×6 mm. Obviously, any other dimensions are allowable as well.

Figure 2B:
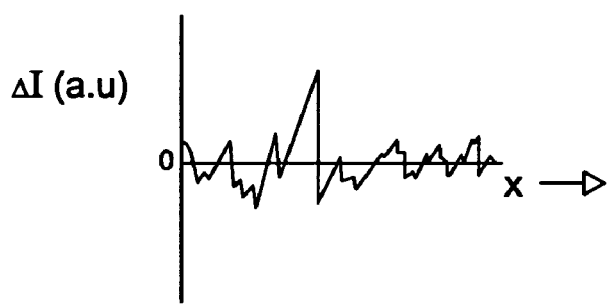

FIG. 2b schematically shows a possible integrated intensity profile of the beam PB of FIG. 2a. The graph shows this intensity in arbitrary units. In principle, as already stated above, uniformity relates to the variation of the accumulated received energy dose as a function of position. It may, however, also relate to the instantaneous intensity as a function of position, if the intensity does not substantially change as a function of time and every position is illuminated during an equal period of time, since then the actual dose is equal to intensity times the illumination time. For a stepper type of illumination, the uniformity will be a value for all of the illuminated field, determined according to uniformity=(maximum dose−minimum dose)/maximum dose, for all of the sampled positions in the illumination field. For a scanning type of illumination, the dose is usually integrated over Y, i.e. along the scanning direction, before calculating the uniformity value over the X-direction. The resulting value is called the integrated slit uniformity.

In the graph of FIG. 2b, there is clearly visible some "noise" like variations in the intensity integrated over Y, with one clearly visible peak a bit to the left of the center of the graph. The peak has a very steep downward slope towards the more positive X-values. In practice such a profile might occur if, for example in the case of a laser being the source of radiation, one of the laser modes is temporarily predominant, or if there is a slight deformation somewhere in the optical system. Other intensity profiles are of course possible, but for understanding the present invention it suffices to look at only one irregularity, the effect of which will be explained with reference to FIGS. 3a and 3b.

FIG. 2b might also represent an instantaneous intensity profile of a beam of radiation in a lithographic apparatus according to the present invention. It is to be noted, however, that according to the dynamic character of the diffuser unit according to the present invention, the intensity profile (i.e. the graph of FIG. 2b) will vary in time. In other words, the position of a peak will vary in time. Furthermore, the intensity profile as a whole will also vary in time, e.g. there may arise one or more new peaks, or peaks may disappear. It is this dynamic behavior, due to the varying positions of diffuser particles in the liquid body of the diffuser unit, which is used in the apparatus and the method according to the present invention.

Figure 3A:
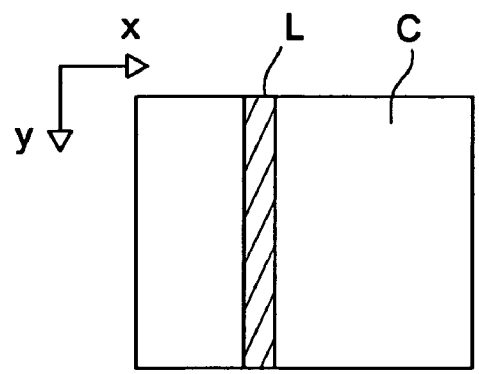
FIGS. 3a and 3b depict the result of illumination with a beam according to FIGS. 2a and 2b, without and with the diffuser unit according to the invention, respectively.

FIG. 3a schematically shows a top view of a target portion C of a substrate W, which has been illuminated by a beam of radiation according to FIG. 2a, 2b in a prior art lithographic apparatus. L indicates a stripe or line having received a higher dose than average.

The target portion C of FIG. 3s has been illuminated by scanning the beam of radiation PB according to FIG. 2a across the surface in the direction Y. Since in the prior art case of FIG. 3a the uniformity correction of the diffuser unit, and thus the uniformity of the obtained image, is constant in time, a certain peak deviation in the uniformity will become a line or stripe L, as can be seen in FIG. 3s. The human eye is very sensitive for such structures, and for example in a CCD, to be used in a video camera etc., a stripe-like non-uniformity of 0.02% or more is visible and should thus be avoided.

Figure 3B:
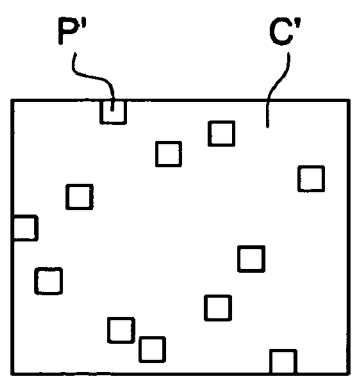

FIG. 3b shows a top view of a target portion C' that has been illuminated by a beam of radiation (not shown), which has for comparison a similar peak in its uniformity profile, but due to its dynamic character according to the present invention, the position of the peak varies in time over the length X of the beam of radiation.

In FIG. 3b this is indicated by the presence of small areas P'. Again just for comparison, the position of the peak in the uniformity profile is assumed to vary discontinuously. Of course, in practice, this variation may also be continuous, e.g. with lamp illumination, which would result in a very wavy line. In a real case, the true dynamic character of the diffuser unit according to the present invention would further result in the relative brightness of such a line, or of the areas P', to vary over the surface of target portion C', improving the uniformity even further.

As can be seen from FIG. 3b, the distribution of the areas P' according to a random pattern, corresponding to the dynamic behavior of the diffuser unit, ensures that the visibility of a line will be much less, or even absent. In other words, uniformity as perceived by the human eye which relates to a local uniformity value, but also as an absolute uniformity value, is improved for illumination with an apparatus or according to a method of the present invention. Note that uniformity should always be related to a field over which the uniformity is determined. An absolute or overall uniformity then relates to the complete illumination field, while a local uniformity relates to only a part of the illumination field. According to this definition, local uniformity will often be better than absolute or overall uniformity, although weighting of the sampled intensity, or determining a position derivative of the local uniformity may give a different picture.

Figure 4:
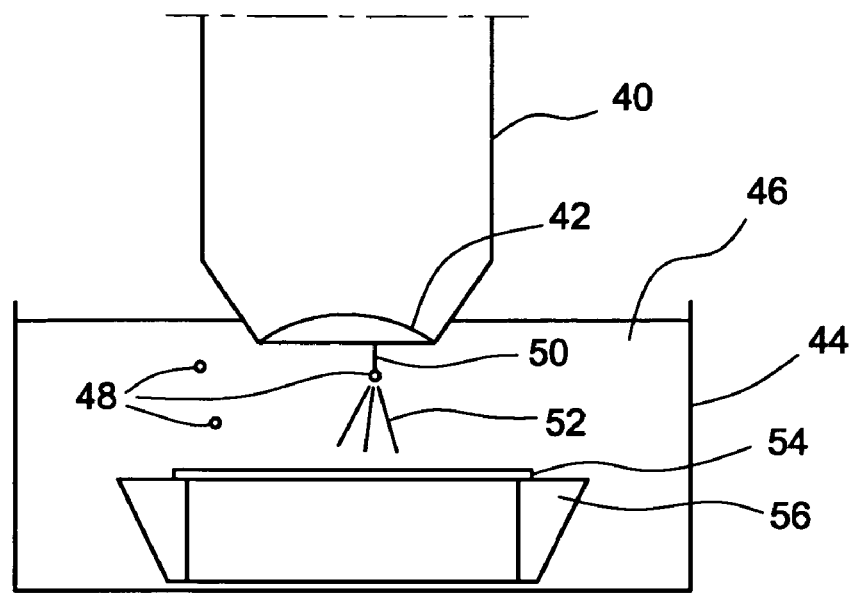
FIG. 4 depicts an embodiment of a lithographic apparatus with a diffuser unit according to the present invention.

FIG. 4 schematically shows a first embodiment of a part of a lithographic apparatus with a diffuser unit according to the present invention. The illumination system includes an illuminator lens 40 with a final lens element 42. A container 44 contains a fluid 46 with diffuser particles 48.

A ray of radiation 50 is scattered and becomes a scattered ray 52. Here, the word 'ray' should be construed as a "pencil-like" part of the full beam of radiation, in order to show the effect of the diffuser particle. The full beam of radiation may then be thought of as being built up of a number of rays, some of which are affected by the diffuser particles, and others which are not affected.

Illuminator lens 40 is very often a complex system with many lens elements. In some optical systems, the final lens element 42 is immersed in a fluid, which is often selected for its optical properties. In the present example, the container 44 holds the fluid 46 that contacts the final lens element 42.

The illuminator lens 40 emits a beam of radiation (not shown), which for the purpose of the present invention may be thought of being composed of a number of rays 50.

When such a ray of radiation 50 meets a diffuser particle 48, the ray will be diffracted, scattered, reflected etc. and become a diffracted, etc. ray (or beam) 52. A similar reasoning will hold for other rays that hit other diffuser particles 48 on their optical path. In effect, this means that the radiation transmitted by the illuminator lens 40 is diffused before it strikes the surface of an object to be illuminated, in this case a mask 54 on a mask table 56. The extent to which the transmitted radiation is diffused depends on the number, size etc. of the diffuser particles 48, a velocity of the fluid 46, etc. This number of diffuser particles may be increased by selecting a greater distance between the final lens 42 and the mask 54, but often this distance depends on the refractive index of the fluid 46 and cannot be changed as desired. In some cases, however, it may be possible to select a fluid 46 with a different refractive index.

As in most lithographic apparatus, the position of the illuminator lens and the mask table 56 with the mask 54 may be changed with respect to each other.

The embodiment described above is given for a fluid between an illuminator lens and a mask. Note that this may be embodied alternatively or additionally as a body of fluid with diffuser particles between a projection lens and a wafer, it being understood that an illuminator lens is meant to be a lens between an illumination source and a patterning device, and a projection lens is meant to be a lens between a patterning device and a substrate such as a wafer. The former position is however preferred over the latter position, since the in latter position, the diffusion action would also destroy part of the pattern information in the beam of radiation.

The container 44 is shown to contain the fluid 46 as well as the mask table 56 with the mask 54. It is, however, also possible that the container is a fluid-tight rim, edge or the like, around the mask 54. The height of such a rim should be sufficient to contain fluid between the desired surfaces, in this case the surface of the mask 54 and the exit surface of the final lens element 42. This not only limits the amount of fluid 46 used, but also allows free control over the movement of the mask table 56. On the other hand, a larger amount of fluid 46 has an advantage, in that it may be easier to control movement of the fluid 46 and thus diffuser particles, between the final lens element 42 and the mask 54. However, naturally occurring movements, such as Brownian movement, etc., may suffice for the present purpose. In that case, no specific moving mechanism for the fluid 46 is required. It is possible to provide a heater which heats the fluid, to promote the Brownian movement, or to provide local temperature differences, etc., which could induce convection currents in the fluid, which would all cause the diffuser particles to move.

Other diffuser particle moving mechanisms, that are not shown here, include a pulsed laser source, a sound wave generator, plates for generating an electromagnetic field, including a varying electromagnetic field, a magnet, including a moveable magnet, etc.

If the number of diffuser particles 48 should be changed, an according amount thereof may be added to the fluid 46, or the fluid 46, together with diffuser particles 48 may be removed and/or replenished. Note that, in general, the type of fluid 46 is less important for the diffusion action, since it often is no more than a carrier for the diffuser particles 48. However, in the case that, for example, density variations, vortices or the like serve as diffuser particles, then the type of fluid should be selected according to those properties. Other properties that may play a role are absorption, and thus transmission of the fluid, UV-stability, etc.

The type of diffuser particles 48 may be selected on desirable criteria. In general, the average diameter of the diffuser particles may be considered a parameter, since this more or less determines its diffusion action. The diameter may be selected according to the criteria mentioned. Furthermore, the number of the diffuser particles may be selected on the basis of knowledge of the uniformity profile of the beam of radiation and the desired correction thereof. For most diffuser particles with an average diameter smaller than the wavelength of the radiation, in particular half the wavelength of the radiation, the type of material or the specific shape of the diffuser particles is less relevant, apart from the case when the diffuser particles are good absorbers for the radiation. Diffuser particles 48 which are substantially larger than the wavelength of the radiation, in at least one direction, may exert an influence on those rays 50 of the radiation that depends on their specific shape. For example, in the case of a reflective material of the diffuser particles 48, the rays 50 may be reflected, which gives a more discrete variation of the uniformity profile. In some cases this may be desirable:

Moreover, if the diffuser particles 48 are gas bubbles, the solubility of the gas in the liquid 46 may be a criterion to select the liquid 46. In particular, a high solubility is often not desirable to have many small gas bubbles. On the other hand, a high solubility at a certain temperature may provide a way of producing a desired quantity of bubbles by changing the temperature of the fluid 46 in the vicinity of the beam of radiation, such that the solubility decreases and bubbles are formed. If desired, this may be a relatively local process.

Figure 5:
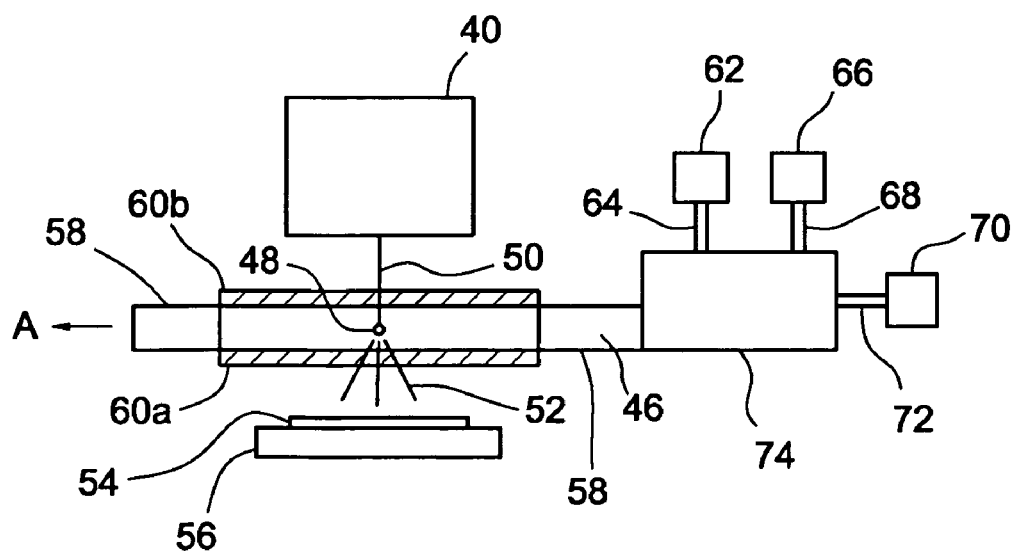
FIG. 5 depicts an embodiment of a lithographic apparatus with a diffuser unit according to the present invention.

FIG. 5 schematically shows another embodiment of the lithographic apparatus, including a diffuser unit, according to the present invention. A tube 58 is connectable to two parallel plates 60*a*, 60*b*, through which and between which, respectively, the fluid 46 may flow in the direction of arrow A.

A first container 62, a second container 66 and a third container 70 are connectable by a first supply feed 64, a second supply feed 68 and a third supply feed 72, respectively, to a control unit 74.

First container 62 may include a first fluid, while second container 66 may contain first diffuser particles 48. Third container 70 may contain a second fluid, a second type of diffuser particles, or e.g. a mixture thereof. It should be appreciated that other distributions of the various substances are possible as well.

The first fluid may include any desired at least partially transparent liquid or flowable substance. In many cases, water is a desirable candidate, but various other liquids are conceivable as well. Examples of the latter are many oils, resins, organic fluids, etc. Note that in the case of moving fluids, stability of the fluid is less important, since the fluid will be refreshed according to the flow rate, which may be selected in accordance with the time during which the fluid is sufficiently stable under the influence of the radiation.

The second container 66 may contain diffuser particles. The diffuser particles may include small solid particles, or another fluid which is immiscible with the fluid, a gas for the formation of gas bubbles in the fluid, etc. Note that in the latter two mentioned cases the contents of the second container 66 are not yet separate diffuser particles, but rather the substance for forming the particles in the fluid. Natural water may already contain sufficient amounts of gases for a desired number of bubbles.

It is possible that the first container 62 contains a fluid already containing diffuser particles, while the second container 66 may also contain a fluid already containing diffuser particles, but with a different concentration. Similarly, the third container 70 may contain a second, or third, fluid, diffuser particles of the same or a different material, or a mixture thereof, etc.

The number of containers may be different from three, and may for example be 1, 2, 4 etc. The first-third supply feeds 64, 68, 72 may be controllably closable, and may open either directly into tube 58, or into control unit 74. The control unit 74, which may include a computer or other programmable device, may be used to control the flow of fluid and/or diffuser particles into a mixed stream into tube 58 and between plates 60*a*, 60*b*. The control unit 74 may for example select the type of fluid, or diffuser particles, or their ratio. Thereto, the control unit 74 and/or the supply feeds 64, 68, 72 may include controllable valves, etc.

The fluid discharged from the tube 58 as shown on the left in FIG. 5 may be connected to one of the containers 62, 66, 70, or to the control unit 74, or in any other way, to form a closed circuit. Such a closed circuit has the advantage that no fluid is lost, and that this diffuser unit may be used in aggressive atmospheres, vacuum, etc. Furthermore, the risk of contamination of the fluid by unknown substances and particles is very much diminished, offering better control over the properties of the fluid.

Furthermore, control unit 74 may include a moving mechanism (not shown) for moving the fluid 46 through the tube 58 and between the plates 60*a*, 60*b*. The moving mechanisms may include a pump, a piston, etc. The movement may be linear, oscillatory, irregular, etc. The flow rate, flow direction and other properties of the flow of the liquid may be selected according to the desired diffusion action.

Note that the plates 60*a*, 60*b* may be connected to form a cavity or the like, having an entrance opening and an exit opening. The plates 60*a*, 60*b* may be made of any suitable material, which should be transparent for the rays 50 of the optical radiation, and should preferably be sufficiently stable under the influence of the radiation as well as of that of the fluid with its possibly abrasive diffuser particles. Of course, it is possible to change the plates 60a, 60b and/or the complete diffuser unit. Suitable materials are quartz, which has a low refraction index, a very high transmission coefficient for radiation down to a very short wavelength and a high abrasion resistance. Other materials may be various types of glass, sapphire, fluoropolymers, CaF2, etc.

Although a number of embodiments have been depicted and described, they are not intended as limiting the present invention.

What is claimed is:

1. A lithographic apparatus, comprising:
   an illumination system configured to condition a beam of radiation;
   a support configured to support a patterning device, the patterning device configured to impart the beam of radiation with a pattern in its cross-section;
   a substrate table configured to hold a substrate;
   a projection system configured to project the patterned beam onto a target portion of the substrate; and
   a diffuser unit configured to homogenize the beam of radiation, the diffuser unit being present in an optical path of the beam of radiation and comprising, in use, a body of liquid, the liquid containing diffuser particles.

2. A lithographic apparatus according to claim 1, wherein, in use, the liquid fills a space that extends between a part of the illumination system and the patterning device.

3. A lithographic apparatus according to claim 1, wherein, in use, the liquid fills a space that extends from a first lens element of the illumination system to one of a second lens element of the illumination system or the patterning device.

4. A lithographic apparatus of claim 1, wherein, in use, the liquid is positioned so that a pupil plane of the beam of radiation is situated in the liquid.

5. A lithographic apparatus according to claim 1, wherein, in use, the liquid extends over at least substantially a cross-sectional area of the beam of radiation.

6. A lithographic apparatus according to claim 1, wherein, in use, the liquid is present between two optical elements.

7. A lithographic apparatus according to claim 6, wherein the two optical elements are parallel.

8. A lithographic apparatus according to claim 6, wherein the liquid and a material of at least one of the optical elements or an optical element of the projection system have an index of refraction that differs less than 0.2.

9. A lithographic apparatus according to claim 1, further comprising a diffuser particle moving mechanism configured to impart a movement to the diffuser particles.

10. A lithographic apparatus according to claim 9, wherein the diffuser particle moving mechanism comprises a pump.

11. A lithographic apparatus according to claim 9, wherein the movement of the liquid has a component which is perpendicular to an optical axis of the lithographic apparatus.

12. A lithographic apparatus according to claim 9, wherein the lithographic apparatus has a scanning direction, and the movement of the liquid is substantially perpendicular to the scanning direction.

13. A lithographic apparatus according to claim 1, wherein the liquid comprises water.

14. A lithographic apparatus according to claim 1, wherein the diffuser particles have an average diameter of at most 200 μm.

15. A lithographic apparatus according to claim 1, wherein the diffuser particles have an average diameter of at most 200 nm.

16. A lithographic apparatus according to claim 1, wherein the diffuser particles have a diameter of at least 5 nm.

17. A lithographic apparatus according to claim 1, wherein the diffuser particles have an average diameter of between 10 and 20 nm.

18. A lithographic apparatus according to claim 1, wherein the diffuser particles comprise gas bubbles, or solid particles, or both.

19. A lithographic apparatus according to claim 18, wherein the gas comprises at least one of air, or nitrogen, or an inert gas, or any combination of the foregoing.

20. A lithographic apparatus according to claim 18, wherein the solid particles comprise a reflective or refractive material.

21. A lithographic apparatus according to claim 1, wherein the diffuser unit is connectable to at least two containers containing different substances, at least one of which is a liquid.

22. A lithographic apparatus according to claim 1, further comprising a control unit configured to control a diffuser particle content of the liquid.

23. A diffuser unit for use in a lithographic apparatus to homogenize a beam of radiation of the lithographic apparatus, the diffuser unit comprising, in use, a body of liquid containing diffuser particles that reduce intensity peaks in the beam that passes therethrough.

24. A diffuser unit according to claim 23, further comprising a diffuser particle moving mechanism configured to impart a movement to the diffuser particles.

25. A diffuser unit according to claim 24, wherein the diffuser particle moving mechanism comprises a pump.

26. A diffuser unit according to claim 23, wherein the liquid comprises water.

27. A diffuser unit according to claim 23, wherein the diffuser particles have an average diameter of at most 200 μm.

28. A diffuser unit according to claim 23, wherein the diffuser particles have an average diameter of at most 200 nm.

29. A diffuser unit according to claim 23, wherein the diffuser particles have a diameter of at least 5 nm.

30. A diffuser unit according to claim 23, wherein the diffuser particles have an average diameter of between 10 and 20 nm.

31. A diffuser unit according to claim 23, wherein the diffuser particles comprise at least one of gas bubbles and solid particles.

32. A diffuser unit according to claim 31, wherein the gas comprises at least one of air, nitrogen, and an inert gas.

33. A diffuser unit according to claim 23, wherein the solid particles comprise a reflective or refractive material.

34. A diffuser unit according to claim 23, wherein the diffuser unit is connectable to at least two containers containing different substances, at least one of which is a liquid.

35. A diffuser unit according to claim 23, further comprising a control unit configured to control a diffuser particle content of the liquid.

36. A method of homogenizing a beam of radiation, comprising providing a beam of radiation in a lithographic apparatus; and
    providing a body of liquid containing diffuser particles, the body of liquid being provided in such a position that at least part of the beam of radiation travels through at least a part of the body of liquid.

37. A method according to claim 36, wherein the diffuser particles are moved with respect to the beam of radiation.

38. A method according to claim 36, wherein the diffuser particles are moved substantially perpendicularly to a direction of the beam of radiation.

39. A method according to claim 36, further comprising:
controlling a diffuser particle content in the liquid in dependence on a desired amount of diffusion in the beam of radiation.

40. A device manufacturing method, comprising:
providing a beam of radiation;
patterning the beam of radiation with a pattern in its cross-section;
projecting the patterned beam of radiation onto a target portion of a substrate; and
homogenizing the beam of radiation by passing the beam of radiation through a liquid containing diffuser particles.

41. A method according to claim 40, wherein the diffuser particles are moved with respect to the beam of radiation.

42. A method according to claim 40, wherein the liquid is moved with respect to the beam of radiation.

* * * * *